(12) United States Patent
Fukuyama

(10) Patent No.: US 9,059,069 B2
(45) Date of Patent: Jun. 16, 2015

(54) LINEAR SENSOR, IMAGE SENSOR, AND ELECTRONIC APPARATUS

(71) Applicant: Sony Corporation, Tokyo (JP)

(72) Inventor: Kandai Fukuyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 13/927,363

(22) Filed: Jun. 26, 2013

(65) Prior Publication Data

US 2014/0008704 A1 Jan. 9, 2014

(30) Foreign Application Priority Data

Jul. 5, 2012 (JP) ................. 2012-151115

(51) Int. Cl.
*H01L 27/146* (2006.01)
*H01L 31/062* (2012.01)
*H01L 27/148* (2006.01)

(52) U.S. Cl.
CPC ...... *H01L 27/14812* (2013.01); *H01L 27/1461* (2013.01); *H01L 27/14643* (2013.01)

(58) Field of Classification Search
CPC .............. H01L 27/14603; H01L 27/14609; H01L 27/14643; H01L 27/14806; H01L 27/14607; H01L 27/14601; H01L 27/14812; H01L 27/1461; H01L 31/0352; H01L 31/035281

USPC ........... 257/E27.133, E27.132, E27.131, 233, 257/431, 443, E31.001, E27.151, E27.13, 257/290–293, 448, E27.122, E31.032, 257/E31.038, E31.113, 215, 234, 258, 323, 257/461, 462, 72; 250/208.1; 348/294, 297, 348/207; 438/73, 57, 60, 48, 66, 75, 78, 90

See application file for complete search history.

(56) References Cited

U.S. PATENT DOCUMENTS

2006/0060753 A1* 3/2006 Rhodes ................ 250/208.1
2012/0119271 A1* 5/2012 Mochizuki et al. .......... 257/292

FOREIGN PATENT DOCUMENTS

JP 05-063176 3/1993

* cited by examiner

*Primary Examiner* — Chuong A Luu
*Assistant Examiner* — Cory Eskridge
(74) *Attorney, Agent, or Firm* — Dentons US LLP

(57) ABSTRACT

There is provided a linear sensor including a plurality of sensor elements that are disposed in line, each including a light sensing part that senses light, generates an electric charge according to an amount of the sensed light, and accumulates the electric charge, a readout gate used to read out the electric charge accumulated in the light sensing part, and a reset gate used to discharge the electric charge accumulated in the light sensing part so as to be reset, wherein a region having a highest concentration of an impurity included in the light sensing part is formed in a position similarly away from the readout gate and the reset gate in the light sensing part.

10 Claims, 10 Drawing Sheets

A

B

LINEAR SENSOR, IMAGE SENSOR, AND ELECTRONIC APPARATUS

BACKGROUND

The present disclosure relates to a linear sensor, an image sensor, and an electronic apparatus, and particularly to a linear sensor, an image sensor, and an electronic apparatus that enable more satisfactory transfer of electric charges.

In the related art, linear sensors in which sensor elements having a light sensing part with a large area are disposed in line have been used in single-lens reflex cameras with an auto-focus function to control focusing.

For example, Japanese Unexamined Patent Application Publication No. H05-63176 discloses a configuration of a CCD (Charge Coupled Device) linear sensor of which a charge storage unit including a light sensing unit is formed in an elongated rectangle, in which a potential difference is set by changing the width of a region having a different impurity concentration toward a charge transfer direction.

SUMMARY

Meanwhile, a CMOS linear sensor using sensor elements with a CMOS (Complementary Metal Oxide Semiconductor) structure has been developed in recent years, and such a CMOS linear sensor is driven at lower voltages (for example, about 3 to 5V) than a CCD linear sensor. For this reason, when a sensor element having a light sensing part with a large area is used, it is more difficult to transfer electric charges in a CMOS linear sensor than in a CCD linear sensor.

Particularly, when sensor elements of a CMOS linear sensor adopt a configuration in which a transfer gate and a reset gate are connected to a light sensing part, it is difficult to satisfactorily transfer electric charges to both the transfer gate and the reset gate.

It is desirable to enable more satisfactory transfer of electric charges.

According to a first embodiment of the present disclosure, there is provided a linear sensor including a plurality of sensor elements that are disposed in line. Each of the plurality of sensor elements may include a light sensing part that senses light, generates an electric charge according to an amount of the sensed light, and accumulates the electric charge, a readout gate used to read out the electric charge accumulated in the light sensing part, and a reset gate used to discharge the electric charge accumulated in the light sensing part so as to be reset, and a region having a highest concentration of an impurity included in the light sensing part may be formed in a position similarly away from the readout gate and the reset gate in the light sensing part.

According to a second embodiment of the present disclosure, there is provided an image sensor, including a plurality of pixels that are disposed in a matrix shape. Each of the pixels may include a light sensing part that senses light, generates an electric charge according to an amount of the sensed light, and accumulates the electric charge, a readout gate used to read out the electric charge accumulated in the light sensing part, and a reset gate used to discharge the electric charge accumulated in the light sensing part so as to be reset, and a region having a highest concentration of an impurity included in the light sensing part may be formed in a position similarly away from the readout gate and the reset gate in the light sensing part.

According to a third embodiment of the present disclosure, there is provided an electronic apparatus, including an image sensor including a plurality of pixels that are disposed in a matrix shape. Each of the pixels may include a light sensing part that senses light, generates an electric charge according to an amount of the sensed light, and accumulates the electric charge, a readout gate used to read out the electric charge accumulated in the light sensing part, and a reset gate used to discharge the electric charge accumulated in the light sensing part so as to be reset, and a region having a highest concentration of an impurity included in the light sensing part may be formed in a position similarly away from the readout gate and the reset gate in the light sensing part.

According to the first to third embodiments of the present disclosure described above, the region in which the concentration of an impurity included in the light sensing part is the highest is formed in the light sensing part in the position substantially the same distance away from the readout gate and the reset gate.

According to the embodiments of the present disclosure, electric charges can be more satisfactorily transferred.

DETAILED DESCRIPTION OF THE EMBODIMENT(S)

Figure 1:
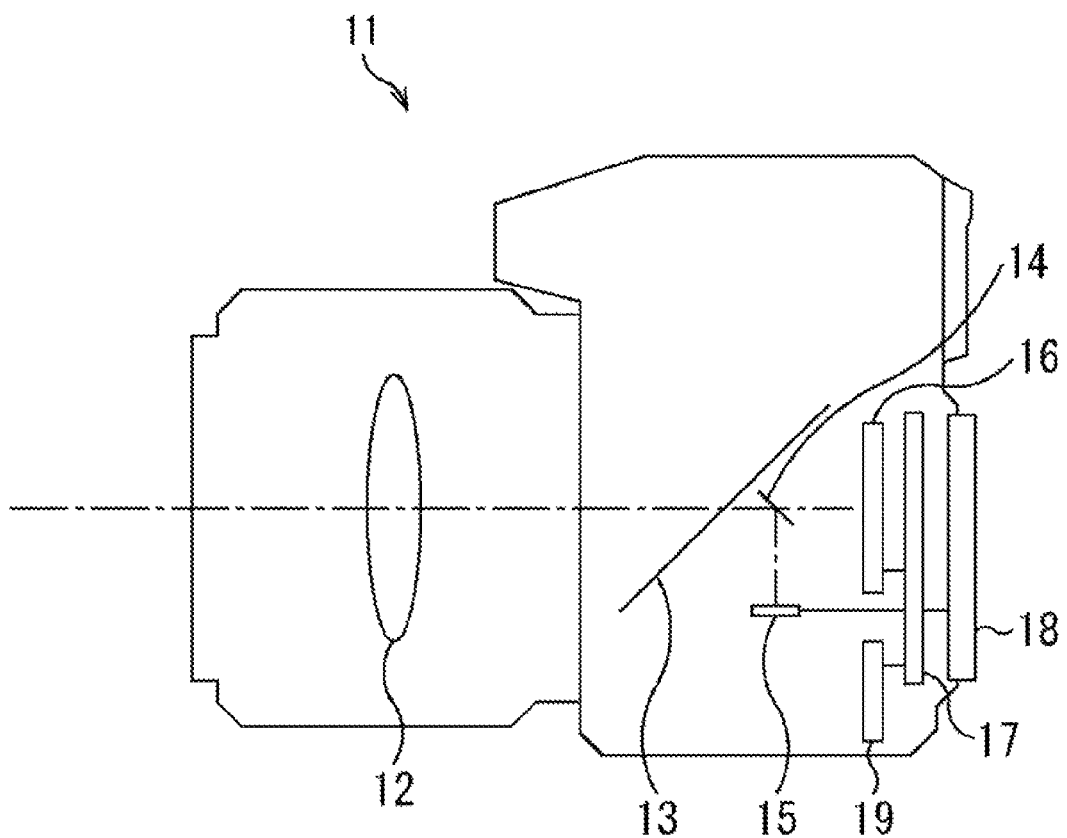
FIG. 1 is a diagram showing a configuration example of an embodiment of an imaging device to which the present technology is applied.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, specific embodiments to which the present technology is applied will be described in detail with reference to the appended drawings.

FIG. 1 is a diagram showing a configuration example of an embodiment of an imaging device to which the present technology is applied.

In FIG. 1, the imaging device 11 is configured to include a lens unit 12, a main mirror 13, a sub mirror 14, a linear sensor 15, an image sensor 16, a signal processing circuit 17, a monitor 18, and a memory 19.

The lens unit 12 is configured to have a plurality of lenses and adjusting unit (not shown) that adjusts the positions of the lenses, and forms an image on a light sensing surface of the image sensor 16 by collecting light incident on the imaging device 11 from a subject. In addition, the lens unit 12 has an auto-focus function that adjusts the focus by causing the position of the image formed on the light sensing surface of the image sensor 16 to correspond to the positions of the lenses adjusted by the adjusting unit according to a control signal supplied from the signal processing circuit 17.

The main mirror 13 is disposed on the optical axis of the lens unit 12, and reflects incident light toward, for example, an optical system used to display images on a finder that is not shown. The sub mirror 14 is disposed on the optical axis of the lens unit 12, and reflects part of incident light toward the linear sensor 15.

The linear sensor 15 is configured such that a plurality of sensor elements are disposed in line therein as will be described with reference to FIGS. 2A and 2B, and supplies electric charge signals of a level according to electric charges generated by each of the sensor elements sensing light to the signal processing circuit 17.

The image sensor 16 senses incident light on the light sensing surface where a plurality of pixels are disposed in a matrix shape, and outputs pixel signals of a level according to electric charges generated by each of the pixels sensing light.

The signal processing circuit 17 forms images by executing various signal processes on pixel signals output from the image sensor 16, and outputs the image data to the monitor 18 and the memory 19. In addition, the signal processing circuit 17 senses a state of focus on the light sensing surface of the image sensor 16 based on signals output from the linear sensor 15, and supplies control signals used to adjust the focus by adjusting the positions of the lenses of the lens unit 12 to the lens unit 12.

The monitor 18 is configured to have a display unit such as a liquid crystal panel, an organic EL (Electro-Luminescence) panel, or the like, and displays images according to image data output from the signal processing circuit 17.

The memory 19 is configured by a flash memory (for example, an EEPROM (Electronically Erasable and Programmable Read Only Memory)) that can be loaded in or unloaded from the imaging device 11, and stores image data output from the signal processing circuit 17.

Next, a configuration of the linear sensor 15 will be described with reference to FIGS. 2A and 2B.

Figure 2:
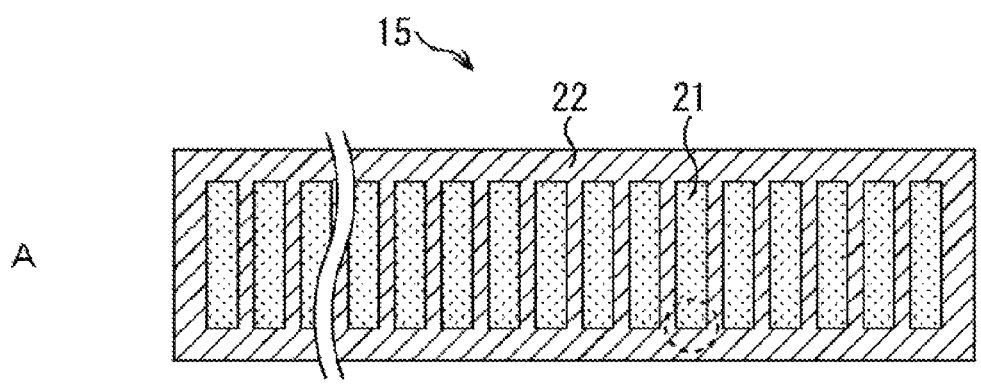
FIGS. 2A and 2B are diagrams showing a configuration example of a linear sensor.
Figure 2:
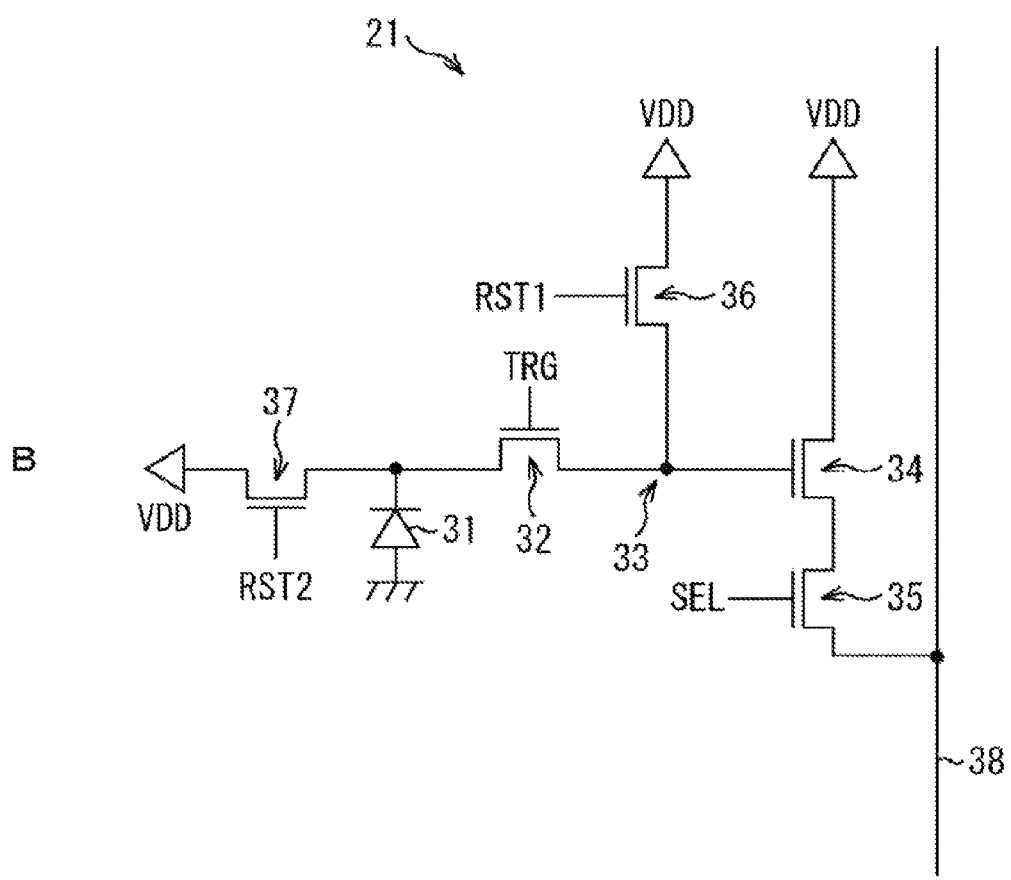

As shown in FIG. 2A, the linear sensor 15 includes a plurality of sensor elements 21 disposed in line therein, and is configured such that each of the sensor elements 21 is separated by an element separation part 22 that is a P-well. In addition, the linear sensor 15 is formed in a rectangle shape elongated in the direction in which the sensor elements 21 are arranged, and each of the sensor elements 21 is formed in a shape elongated in the direction substantially orthogonal to the longitudinal direction of the linear sensor 15.

In addition, as shown in FIG. 2B, the sensor elements 21 are formed in the CMOS (Complementary Metal Oxide Semiconductor) structure.

In other words, each of the sensor elements 21 is configured to include a light sensing part 31, a readout gate 32, a floating diffusion 33, an amplifying gate 34, a selecting gate 35, and reset gates 36 and 37. In addition, each of the sensor elements 21 is connected to an output signal line 38 for outputting electric charge signals to the signal processing circuit 17 of FIG. 1.

The light sensing part 31 senses light incident on the linear sensor 15, and generates an electric charge according to the amount of sensed light so as to accumulate the electric charge. For example, the light sensing part 31 is a photodiode configured by p-n junction of a semiconductor, the anode thereof is grounded, and the cathode thereof is connected to the readout gate 32 and the reset gate 37.

The readout gate 32 is driven according to readout signals TRG, and the electric charge accumulated in the light sensing part 31 is read out in the floating diffusion 33 at a timing at which the readout gate 32 is turned on.

The floating diffusion 33 is a floating diffusion region having a predetermined capacitance that is formed on the connection point of gate electrodes of the readout gate 32 and the amplifying gate 34, and accumulates the electric charge therein read out from the light sensing part 31 via the readout gate 32.

The amplifying gate 34 is connected to power supply potential VDD, and outputs electric charge signals obtained by converting the electric charge accumulated in the floating diffusion 33 into a voltage of a level according to the electric charge.

The selecting gate 35 is driven according to selection signals SEL, and when the selecting gate 35 is turned on, electric charge signals output from the amplifying gate 34 are in a state in which the signals can be output to the output signal line 38 via the selecting gate 35.

The reset gate 36 is driven according to first reset signals RST1, and when the reset gate 36 is turned on, the electric charge accumulated in the floating diffusion 33 is discharged to the power supply potential VDD via the reset gate 36. Accordingly, the floating diffusion 33 is reset to the power supply potential VDD.

The reset gate 37 is driven according to second reset signals RST2, and while the electric charge is accumulated in the floating diffusion 33, the reset gate discharges the electric charge accumulated in the light sensing part 31 to the power supply potential VDD. In addition, a potential of the reset gate 37 is formed to be lower than a potential of the readout gate 32, an electric charge overflowing from the light sensing part 31 is discharged on the reset gate 37 side. In addition, by providing the reset gate 37, an exposure period of the light sensing part 31 can be adjusted, for example, can be further shortened than a reset period of the floating diffusion 33, and accordingly, a shortest accumulating time can be adjusted.

In addition, as the light sensing part 31 is formed in a shape elongated in the direction substantially orthogonal to the longitudinal direction of the linear sensor 15 in the sensor element 21, the readout gate 32 and the reset gate 37 are formed in the lower end portion thereof (for example, the lower end portion indicated by the dashed-lined circle in FIG. 2A).

Figure 3:
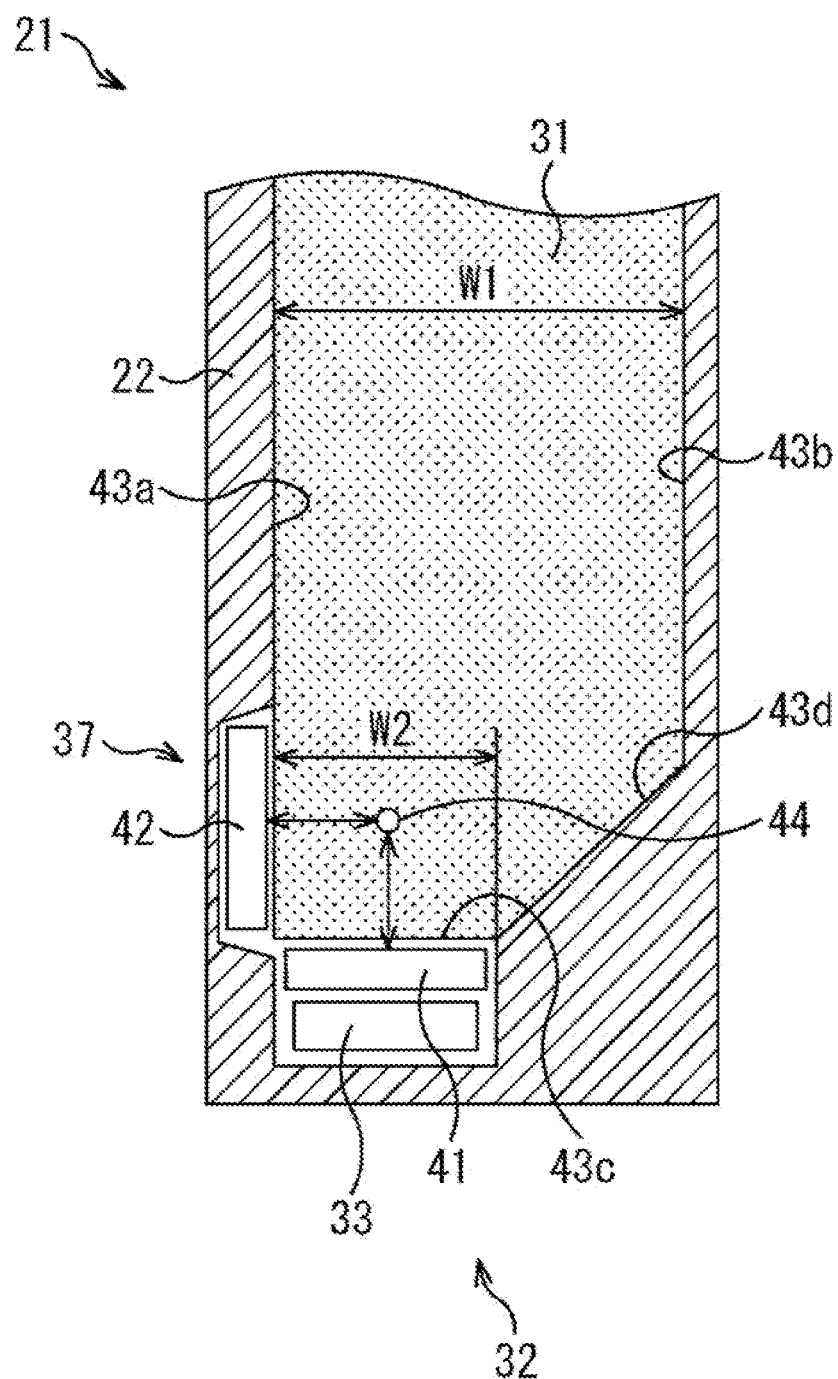
FIG. 3 is a diagram showing a first configuration example of a sensor element.

FIG. 3 is a diagram showing a first configuration example of the sensor element 21.

FIG. 3 shows the structure of the periphery of the lower end portion of the sensor element 21, and in the lower end portion of the sensor element 21, a gate electrode 41 constituting the readout gate 32, and another gate electrode 42 constituting the reset gate 37 are disposed. In addition, on the opposite side of the light sensing part 31 from the gate electrode 41 in the sensor element 21, an N-type region that serves as the floating diffusion 33 is formed.

In addition, in the sensor element 21, among the side surfaces surrounding the light sensing part 31 formed in an elongated shape, a left side surface that is one long side is set to be a left side surface 43a, a right side surface that is the other long side is set to a right side surface 43b, and a lower side surface that is one short side is set to a lower side surface 43c. In addition, between the right side surface 43b and the lower side surface 43c of the sensor element 21, an inclined side surface 43d that is inclined respectively to the right side surface 43b and the lower side surface 43c is formed.

As the inclined side surface 43*d* is formed in that manner, the sensor element 21 is structured such that the width of the light sensing part 31 becomes narrower toward the lower part thereof, and accordingly, the width W2 of the readout gate 32 is narrower than the width W1 of the light sensing part 31 from the left side surface 43*a* to the right side surface 43*b*.

In addition, the readout gate 32 is disposed so as to approach on the left side surface 43*a* of the light sensing part 31, and the reset gate 37 is disposed at the end portion of the left side surface 43*a* of the light sensing part 31 on the side of the lower side surface 43*c*. In other words, within the angle formed by the lower side surface 43*c* and the left side surface 43*a* of the light sensing part 31, the readout gate 32 is disposed along the lower side surface 43*c*, and the reset gate 37 is disposed along the left side surface 43*a*.

In addition, in the sensor element 21, a high impurity concentration region 44 is formed in a position the substantially same distance away from the readout gate 32 and the reset gate 37. In the light sensing part 31, the high impurity concentration region 44 is a region having the highest impurity concentration constituting the light sensing part 31, for example, a region having a high concentration of N-type dopants.

The sensor element 21 is configured as described above, and the high impurity concentration region 44 is formed in the position substantially the same distance away from the readout gate 32 and the reset gate 37. Accordingly, even when the readout gate 32 and the reset gate 37 are configured to be driven at a low voltage in the sensor element 21, electric charges can be satisfactorily transferred to both sides of the readout gate 32 and the reset gate 37. In other words, since the same driving voltage is applied to the readout gate 32 and the reset gate 37, modulation levels thereof are thereby the same, and the distance from the high impurity concentration region 44 is also substantially the same, electric charges can be transferred to the readout gate 32 and the reset gate 37 with the same level of transfer efficiency.

In addition, by forming the inclined side surface 43*d* in the sensor element 21, it is easy to form a flow of electric charges toward the readout gate 32 and the reset gate 37 near the lower end of the light sensing part 31, and accordingly, transfer efficiency of electric charges can be further enhanced.

In addition, by forming the width W2 of the readout gate 32 to be narrower than the width W1 of the light sensing part 31 in the sensor element 21, the width of the floating diffusion 33 can be narrow. Accordingly, it is possible to avoid a reduction in conversion efficiency when electric charges are converted to a voltage in the floating diffusion 33.

For example, when a gate voltage that drives the gate electrodes 41 and 42 is set to 3V, electric charges can be satisfactorily transferred by setting the distance from the high impurity concentration region 44 of the light sensing part 31 to each of the readout gate 32 and the reset gate 37 to be 1 μm or shorter. More preferably, electric charges can be satisfactorily transferred by setting the distance to be 0.5 to 0.6 μm. To be specific, the sensor element 21 is designed such that the widths of the readout gate 32 and the reset gate 37 are 4 to 5 μm, and the distance from the readout gate 32 and the reset gate 37 to the high impurity concentration region 44 is about 0.6 μm.

Here, a sensor element used in a linear sensor of the related art will be described with reference to FIG. 4. It should be noted that the same reference numerals are given in FIG. 4 with respect to the configuration common to the sensor element 21 of FIG. 3, and detailed description thereof will be omitted.

Figure 4:
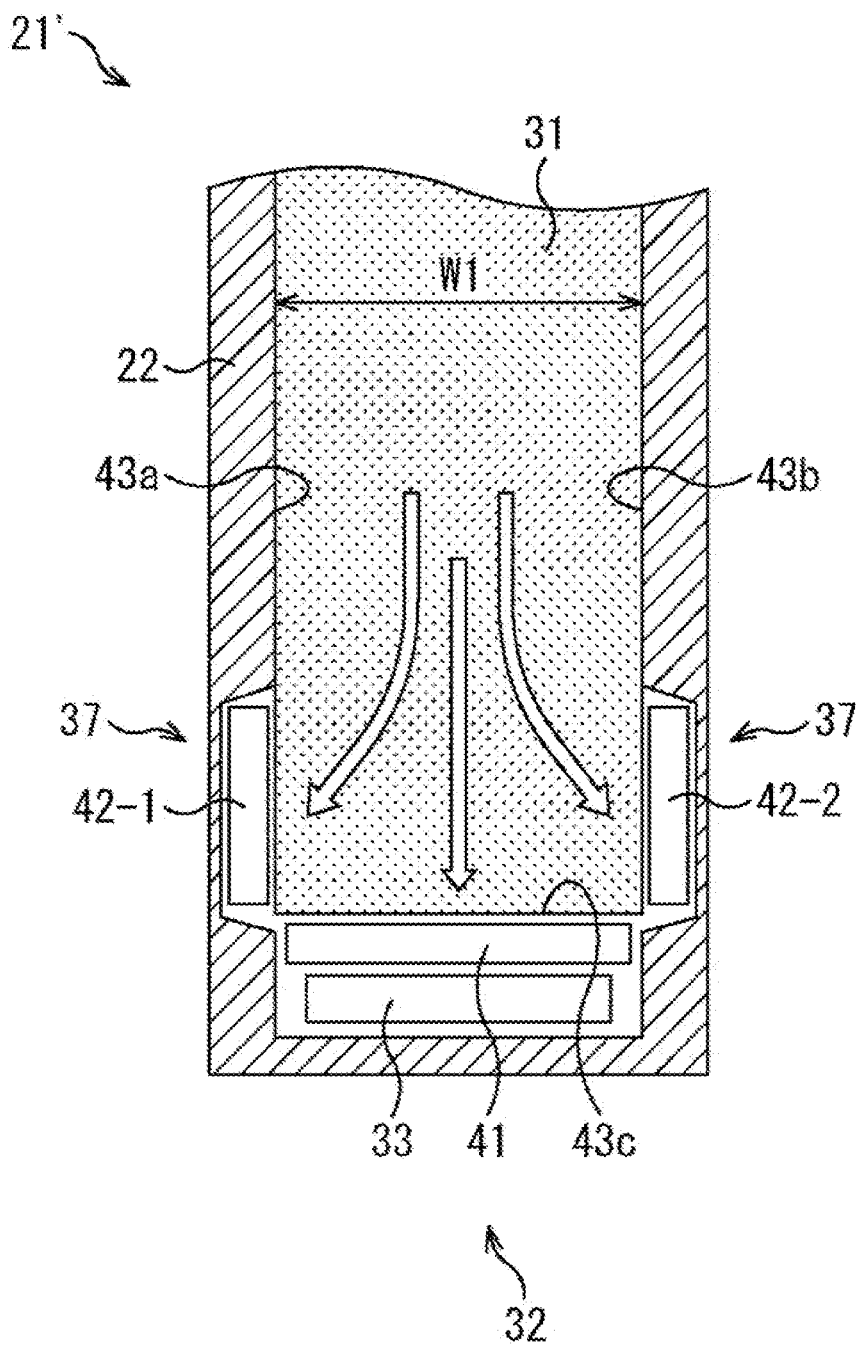
FIG. 4 is a diagram showing a configuration example of a sensor element of the related art.

As shown in FIG. 4, in the sensor element 21' of the related art, the readout gate 32 is formed on the entire lower side surface 43*c* of the light sensing part 31. In addition, the reset gate 37 includes two gate electrodes 42-1 and 42-2, the gate electrode 42-1 is disposed along the left side surface 43*a* of the light sensing part 31, and the gate electrode 42-2 is disposed along the right side surface 43*b* of the light sensing part 31.

In the sensor element 21' of the related art configured as described above, it is difficult to form a high impurity concentration region in a position substantially the same distance away from the readout gate 32 and the gate electrodes 42-1 and 42-2 of the reset gate 37. Thus, it is difficult to satisfactorily transfer electric charges to both sides of the readout gate 32 and the reset gate 37. Nevertheless, in the case of a CCD-type linear sensor, for example, electric charges can be transferred due to a high driving voltage, but a CMOS-type linear sensor is driven at a lower voltage than the CCD-type linear sensor, and performance of transferring electric charges is lowered.

On the contrary, in the sensor element 21, electric charges can be satisfactorily transferred to both sides of the readout gate 32 and the reset gate 37 as described above, and even if the linear sensor 15 is the CMOS type that is driven at a low voltage, deterioration in electric charge transfer performance can be avoided.

In addition, since both of the light sensing part 31 and the readout gate 32 are formed with the width W1 in the sensor element 21', the width of the floating diffusion 33 is further widened, and the capacitance of the floating diffusion 33 is larger than those in the sensor element 21 of FIG. 3. For these reasons, the sensor element 21' is assumed to have lowered conversion efficiency in the floating diffusion 33.

On the other hand, the sensor element 21 is formed such that the width W2 of the readout gate 32 is narrower than the width W1 of the light sensing part 31, and thus, it is possible to avoid deterioration in conversion efficiency in the floating diffusion 33.

Figure 5:
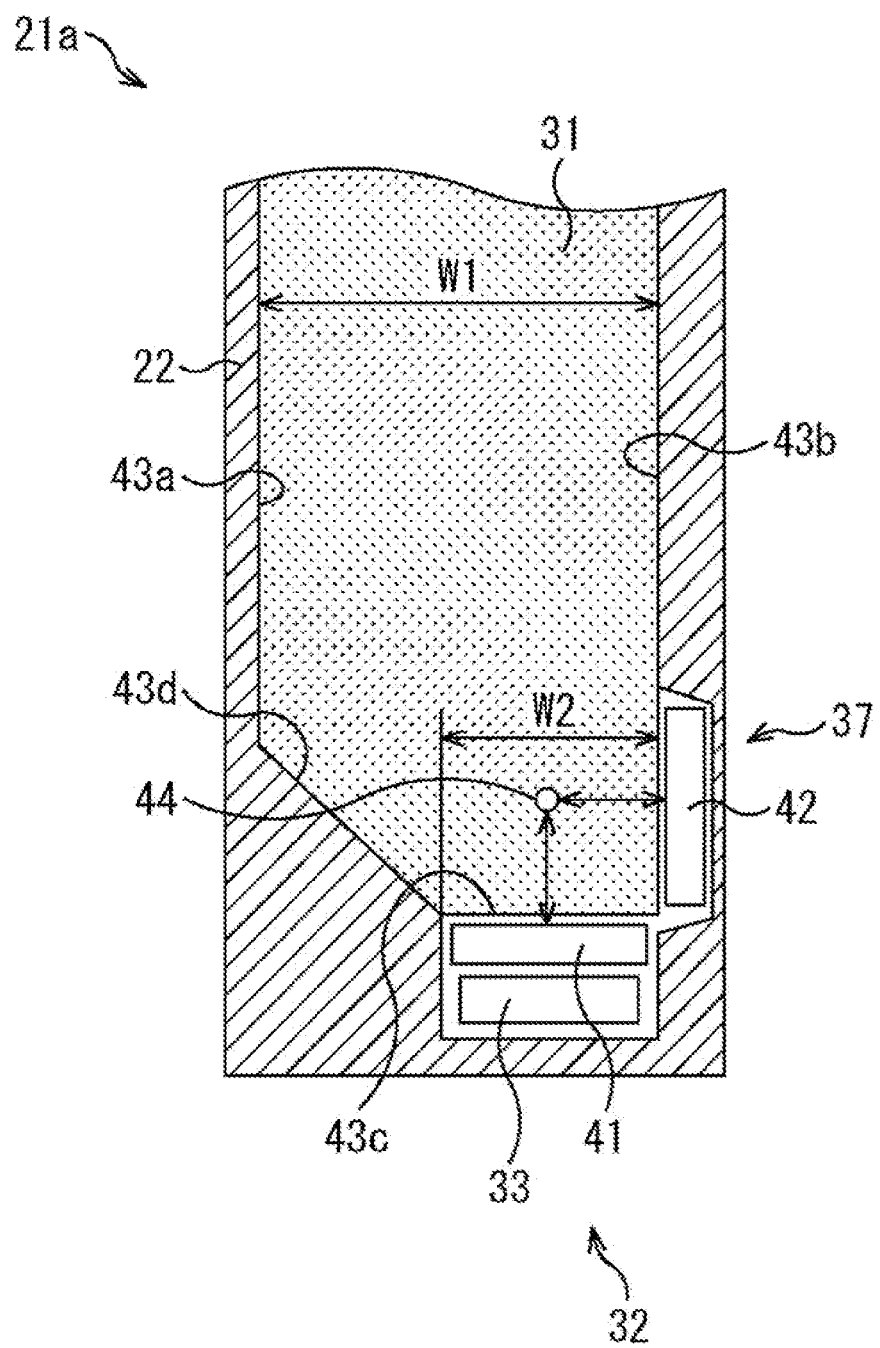
FIG. 5 is a diagram showing a second configuration example of the sensor element.

FIG. 5 is a diagram showing a second configuration example of the sensor element. It should be noted that the same reference numerals are given in FIG. 5 with respect to the configuration common to the sensor element 21 of FIG. 3, and detailed description thereof will be omitted.

In the sensor element 21*a* configured as illustrated in FIG. 5, the readout gate 32 is disposed along the lower side surface 43*c* approaching the right side surface 43*b* of the light sensing part 31, and the reset gate 37 is disposed in the end portion of the right side surface 43*b* of the light sensing part 31 on the side of the lower side surface 43*c*. In addition, the inclined side surface 43*d* is formed between the left side surface 43*a* and the lower side surface 43*c* so as to be inclined respectively to the left side surface 43*a* and the lower side surface 43*c*. In other words, the sensor element 21*a* is formed bilaterally symmetric with the sensor element 21.

In the same manner as in the sensor element 21 of FIG. 3, the sensor element 21*a* configured as above has the high impurity concentration region 44 that is formed in a position substantially the same distance away from the readout gate 32 and the reset gate 37, and accordingly, electric charges can be satisfactorily transferred to both of the readout gate 32 and the reset gate 37. In addition, in the sensor element 21*a*, efficiency of electric charge transfer can be enhanced due to the inclined side surface 43*d*, and deterioration in conversion efficiency in the floating diffusion 33 can be avoided.

Figure 6:
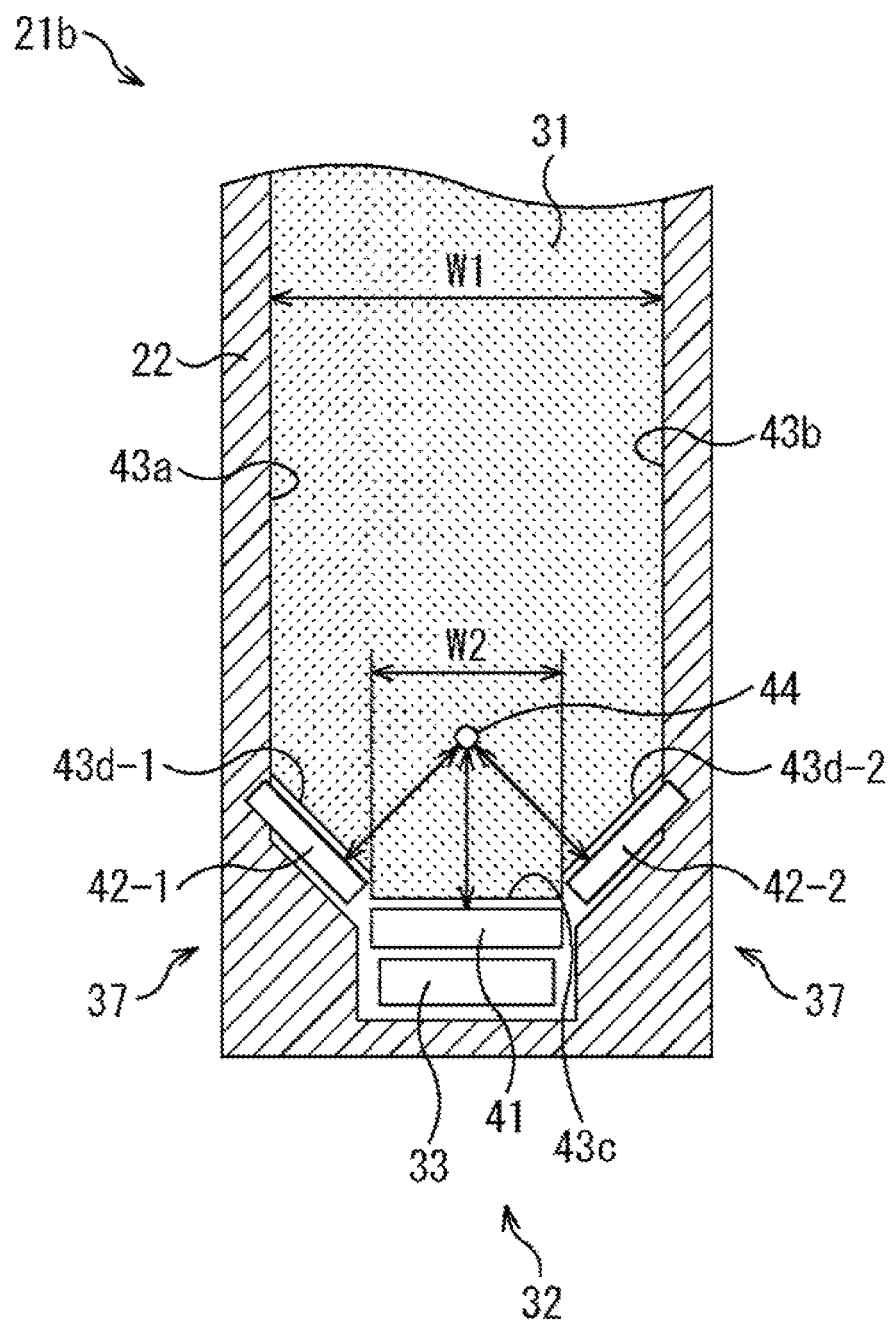
FIG. 6 is a diagram showing a third configuration example of the sensor element.

FIG. 6 is a diagram showing a third configuration example of the sensor element. It should be noted that the same reference numerals are given in FIG. 6 with respect to the configuration common to the sensor element 21 of FIG. 3, and detailed description thereof will be omitted.

In the sensor element 21b as shown in FIG. 6, an inclined side surface 43d-1 is formed from the left side surface 43a of the light sensing part 31 to the lower side surface 43c, and an inclined side surface 43d-2 is formed from the right side surface 43b of the light sensing part 31 to the lower side surface 43c.

Thus, whereas the readout gate 32 is disposed along the lower side surface 43c approaching on the side of the left side surface 43a in the sensor element 21 of FIG. 3, the readout gate 32 is disposed along the lower side surface 43c at the center of the lower portion of the light sensing part 31 in the sensor element 21b. In addition, in the sensor element 21b, the reset gate 37 has two gate electrodes 42-1 and 42-2, the gate electrode 42-1 is disposed along the inclined side surface 43d-1, and the gate electrode 42-2 is disposed along the inclined side surface 43d-2.

In addition, in the same manner as in the sensor element 21 of FIG. 3, the high impurity concentration region 44 is formed in a position substantially the same distance away from the readout gate 32 and (the gate electrodes 42-1 and 42-2 of) the reset gate 37 also in the sensor element 21b. Thus, electric charges can be satisfactorily transferred to both of the readout gate 32 and the reset gate 37 in the sensor element 21b. In addition, efficiency of electric charge transfer can be enhanced due to the inclined side surfaces 43d-1 and 43d-2, and deterioration in conversion efficiency in the floating diffusion 33 can be avoided in the sensor element 21b.

Figure 7:
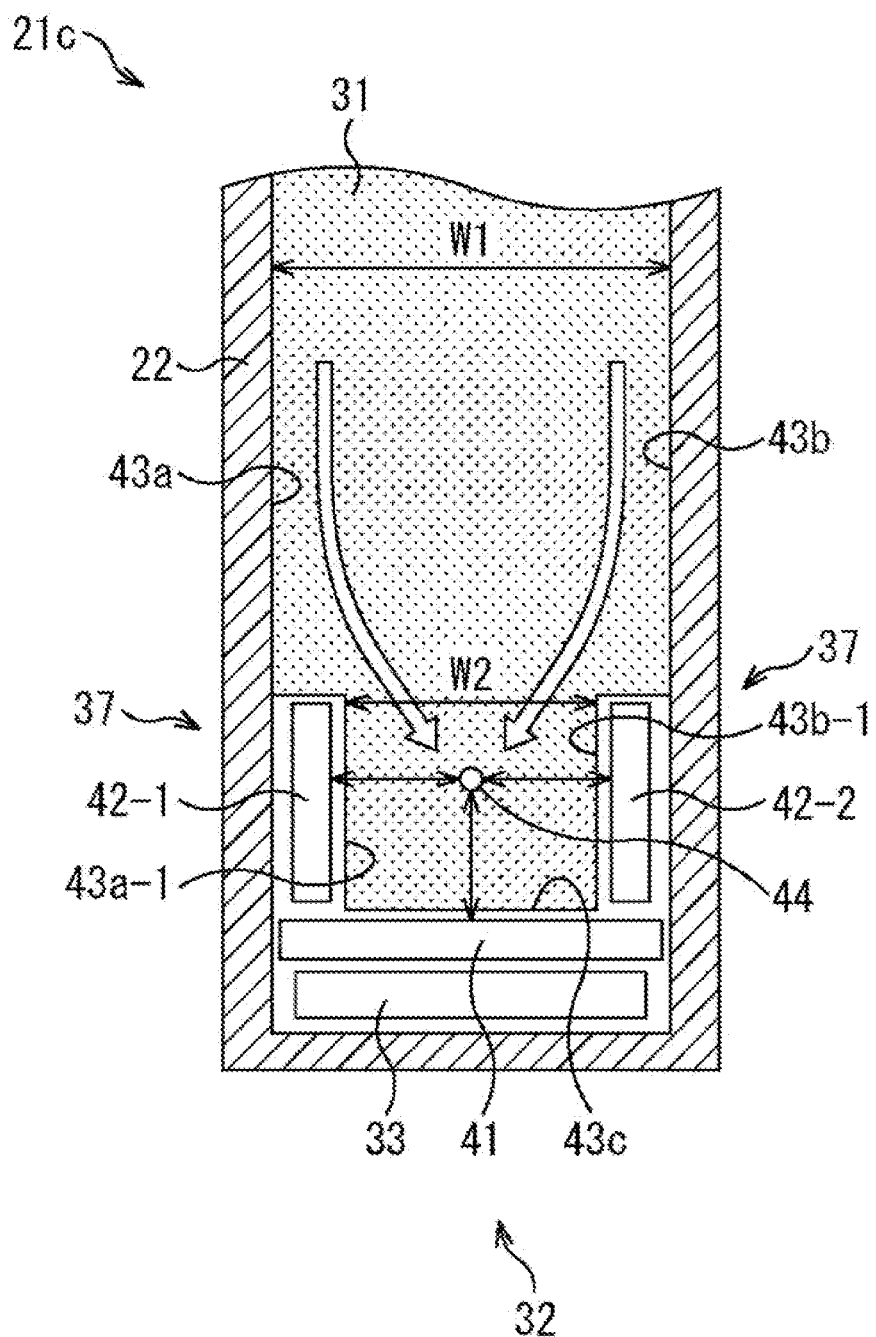
FIG. 7 is a diagram showing a fourth configuration example of the sensor element.

FIG. 7 is a diagram showing a forth configuration example of the sensor element. It should be noted that the same reference numerals are given in FIG. 7 with respect to the configuration common to the sensor element 21 of FIG. 3, and detailed description thereof will be omitted.

In the sensor element 21c as shown in FIG. 7, a step portion 43a-1 is formed in the periphery of the lower side surface 43c along the left side surface 43a of the light sensing part 31, and another step portion 43b-1 is formed in the periphery of the lower side surface 43c along the right side surface 43b of the light sensing part 31. The step portions 43a-1 and 43b-1 are formed in parallel with the left side surface 43a and the right side surface 43b so that the interval thereof is narrower than the interval of the left side surface 43a and the right side surface 43b.

In addition, in the sensor element 21c, the reset gate 37 is configured to have the two gate electrodes 42-1 and 42-2, the gate electrode 42-1 is disposed in the step portion 43a-1, and the gate electrode 42-2 is disposed in the step portion 43b-1. In addition, in the same manner as in the sensor element 21 of FIG. 3, the high impurity concentration region 44 is also formed in a position substantially the same distance away from the readout gate 32 and (the gate electrodes 42-1 and 42-2 of) the reset gate 37 in the sensor element 21c.

Thus, in the sensor element 21c, electric charges can be satisfactorily transferred to both of the readout gate 32 and the reset gate 37. In addition, in the sensor element 21c, the width of the light sensing part 31 near the readout gate 32 and the reset gate 37 is set to be narrow by forming the step portions 43a-1 and 43b-1. Accordingly, the sensor element 21c can easily collect electric charges in the periphery of the readout gate 32 and the reset gate 37, and accordingly, transfer efficiency can be enhanced.

Figure 8:
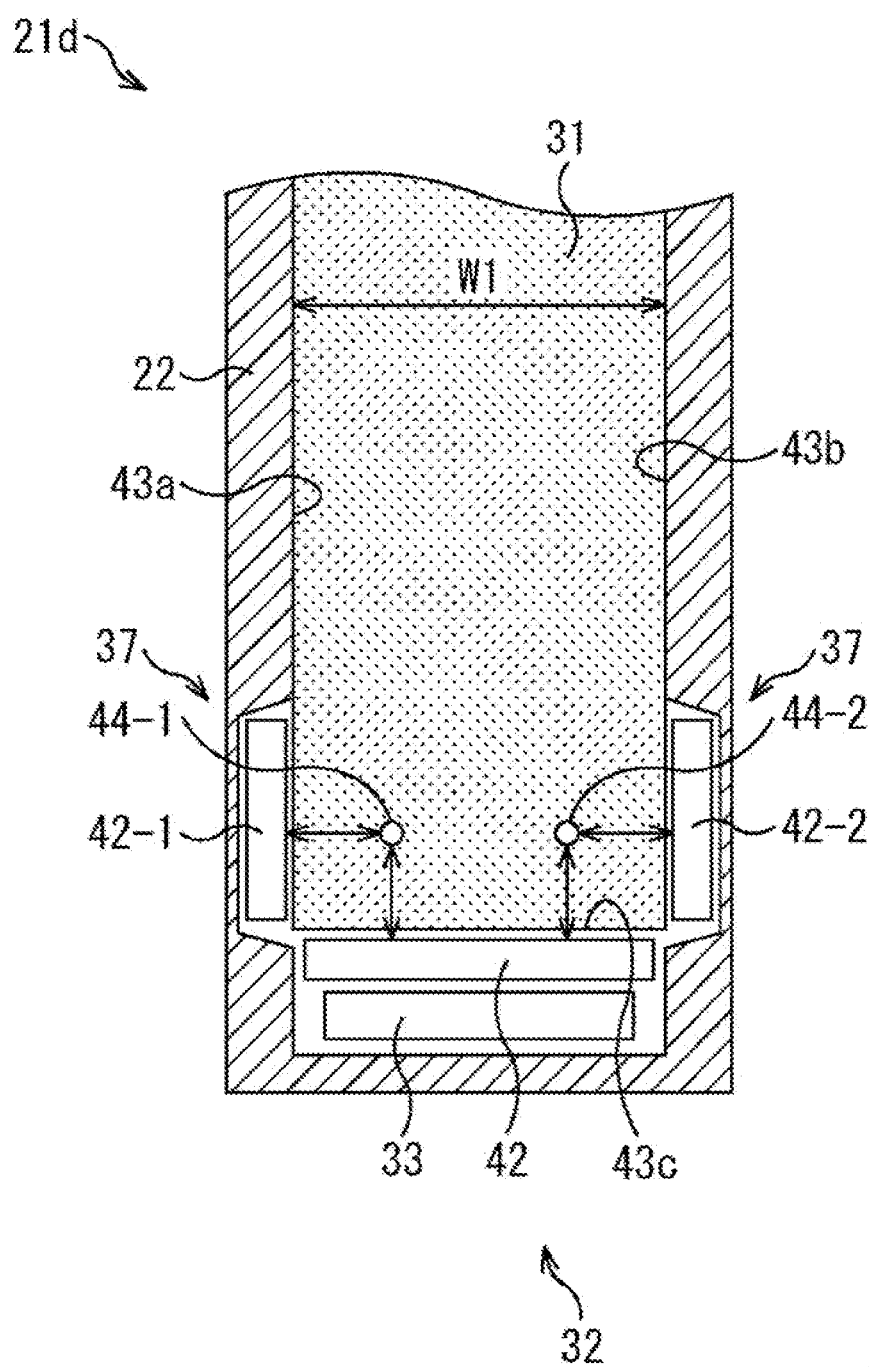
FIG. 8 is a diagram showing a fifth configuration example of the sensor element.

FIG. 8 is a diagram showing a fifth configuration example of the sensor element. It should be noted that the same reference numerals are given in FIG. 8 with respect to the configuration common to the sensor element 21 of FIG. 3, and detailed description thereof will be omitted.

In the sensor element 21d as shown in FIG. 8, the readout gate 32 is disposed along the lower side surface 43c. In addition, the gate electrode 42-1 constituting the reset gate 37 is disposed in the end portion of the left side surface 43a of the light sensing part 31 on the side of the lower side surface 43c, and the gate electrode 42-2 constituting the reset gate 37 is disposed in the end portion of the right side surface 43b of the light sensing part 31 on the side of the lower side surface 43c.

In addition, in the sensor element 21d, high impurity concentration regions 44-1 and 44-2 are formed in two locations. In other words, the high impurity concentration region 44-1 is formed in a position substantially the same distance away from the readout gate 32 and the gate electrode 42-1 of the reset gate 37. On the other hand, the high impurity concentration region 44-2 is formed in a position substantially the same distance away from the readout gate 32 and the gate electrode 42-2 of the reset gate 37.

In this manner, by forming the high impurity concentration regions 44-1 and 44-2 divided in both sides, electric charge transfer to the readout gate 32 and electric charge transfer to both gate electrodes 42-1 and 42-2 of the reset gate 37 can be satisfactorily performed.

In addition, in the sensor element 21d, the width of the readout gate 32 is set to be the same as the width W1 of the light sensing part 31. Accordingly, the floating diffusion 33 can be formed large, and thus, for example, the amount of electric charges that the floating diffusion 33 can accumulate can be set to be larger than in the sensor element 21 of FIG. 3.

Figure 9:
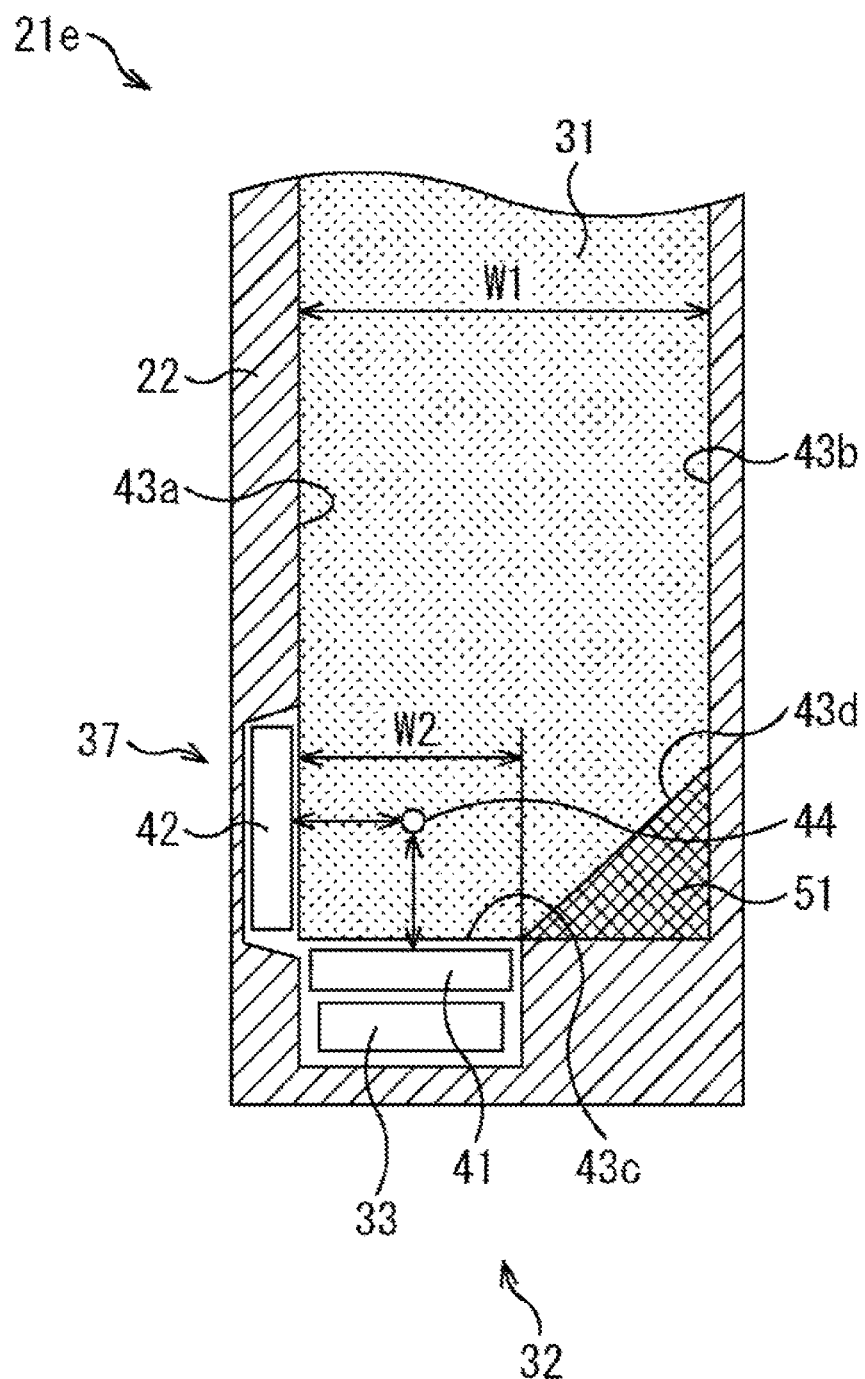
FIG. 9 is a diagram showing a sixth configuration example of the sensor element.

FIG. 9 is a diagram showing a sixth configuration example of the sensor element. It should be noted that the same reference numerals are given in FIG. 9 with respect to the configuration common to the sensor element 21 of FIG. 3, and detailed description thereof will be omitted.

A sensor element 21e as shown in FIG. 9 is configured different from the sensor element 21 of FIG. 3 in that a P-type region 51 is formed therein. In other words, whereas the inclined side surface 43d is formed by the element separation part 22 in the sensor element 21 of FIG. 3, the inclined side surface 43d is formed by the P-type region 51 in the sensor element 21e. It should be noted that, when the light sensing part 31 is formed through ion-implantation of an N-type impurity, the P-type region 51 is formed through ion-implantation of a P-type impurity, conversely to the light sensing part 31.

In the sensor element 21e configured in this manner, as the width W1 of the light sensing part 31 becomes narrower toward the lower side surface 43c due to the inclined side surface 43d, the flow of electric charges running toward the readout gate 32 and the reset gate 37 is easily formed in the same manner as in the sensor element 21 of FIG. 3, and thereby efficiency in electric charge transfer can be enhanced.

In addition, the structures of the sensor element 21 in the configuration examples described above can be applied to, for example, pixels of the image sensor 16 in addition to the linear sensor 15.

Figure 10:
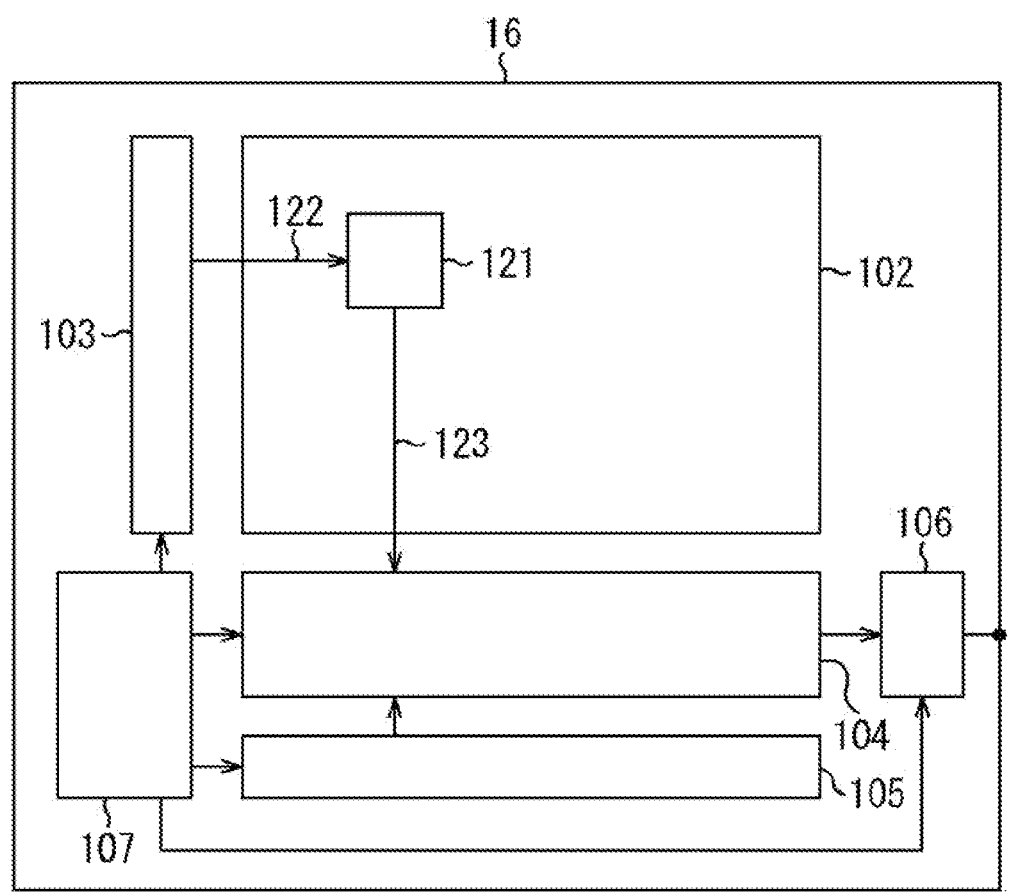
FIG. 10 is a diagram showing a configuration example of an image sensor.

Next, FIG. 10 is a block diagram showing a configuration example of the image sensor 16 that includes pixels with the same structure as the sensor element 21.

As shown in FIG. 10, the image sensor 16 is configured to include a pixel array unit 102, a vertical drive unit 103, a column processing unit 104, a horizontal drive unit 105, an output unit 106, and a drive control unit 107.

The pixel array unit 102 has a plurality of pixels 121 disposed in an array shape, and is connected to the vertical drive unit 103 via a plurality of horizontal signal lines 122 in accordance with the number of row of the pixels 121, and to the column processing unit 104 via a plurality of vertical signal lines 123 in accordance with the number of columns of the pixels 121. In other words, the plurality of pixels 121 that the pixel array unit 102 has are respectively disposed at points at which the horizontal signal lines 122 and the vertical signal lines 123 intersect.

The vertical drive unit 103 sequentially supplies drive signals (transfer signals, selection signals, reset signals, and the like) used to drive each of the pixels 121 to the rows of the plurality of pixels 121 that the pixel array unit 102 has via the horizontal signal lines 122.

The column processing unit 104 extracts signal levels of pixel signals by performing a CDS (Correlated Double Sampling) process on the pixel signals output from each of the pixels 121 via the vertical signal lines 123, and acquires pixel data according to the amount of light sensed by the pixels 121.

The horizontal drive unit 105 sequentially supplies to the column processing unit 104 drive signals used to cause pixel data acquired from each of the pixels 121 to be output from the column processing unit 104 in order for each column of the plurality of pixels 121 that the pixel array unit 102 has.

Pixel data is supplied to the output unit 106 from the column processing unit 104 at timings according to drive signals of the horizontal drive unit 105, and the output unit 106, for example, amplifies the pixel data so as to be output to an image processing circuit in the latter stage.

The drive control unit 107 controls each unit provided inside the image sensor 16 to be driven. For example, the drive control unit 107 generates clock signals according to drive cycles of each unit, and then supplies the signals to each unit.

By configuring the pixels 121 of the image sensor 16 configured as described above in the same manner as in, for example, the sensor element 21 of FIG. 3, the image sensor 16 which has better efficiency in transferring electric charges, and conversion efficiency in the floating diffusion 33 can be realized.

Furthermore, the structures of the sensor element 21 in the configuration examples described above are not limited to the CMOS-type linear sensor 15 or image sensor 16, and may be applied to, for example, a CCD-type linear sensor or image sensor.

In addition, the linear sensor 15 or the image sensor 16 can be applied to various kinds of electronic apparatuses such as digital video cameras, mobile telephones with an imaging function, and other apparatuses with an imaging function, in addition to the imaging device 11 shown in FIG. 11.

Additionally, the present technology may also be configured as below.

(1)
A linear sensor including:
a plurality of sensor elements that are disposed in line, each including
a light sensing part that senses light, generates an electric charge according to an amount of the sensed light, and accumulates the electric charge,
a readout gate used to read out the electric charge accumulated in the light sensing part, and
a reset gate used to discharge the electric charge accumulated in the light sensing part so as to be reset,
wherein a region having a highest concentration of an impurity included in the light sensing part is formed in a position similarly away from the readout gate and the reset gate in the light sensing part.

(2)
The linear sensor according to (1),
wherein the readout gate is disposed along a lower side surface that is a short side of the light sensing part formed in an elongated shape, and
wherein the reset gate is disposed in an end portion of one side surface that is a long side of the light sensing part on the lower side surface side.

(3)
The linear sensor according to (1) or (2),
wherein a width of the readout gate is narrower than the width between side surfaces that are long sides of the light sensing part, and
wherein the readout gate is disposed nearer to the one side surface of the light sensing part where the reset gate is disposed.

(4)
The linear sensor according to any one of (1) to (3), wherein an inclined surface is formed, to the lower side surface, from a side surface that is opposite to the one side surface of the light sensing part where the reset gate is disposed.

(5)
The linear sensor according to any one of (1) to (4), wherein, in an angle portion formed by the lower side surface and a side surface that is opposite to the one side surface of the light sensing part where the reset gate is disposed, a region having a high concentration of an impurity of which a type is different from a type of the impurity included in the light sensing part is formed so that a width of the light sensing part becomes narrower toward the lower side surface.

(6)
The linear sensor according to (1),
wherein the readout gate is disposed along a lower side surface that is a short side of the light sensing part formed in an elongated shape, and
wherein a pair of the reset gates are disposed respectively along a pair of inclined surfaces that are inclined from side surfaces that are long sides of the light sensing part to the lower side surface.

(7)
The linear sensor according to (1),
wherein the readout gate is disposed along a lower side surface that is a short side of the light sensing part formed in an elongated shape, and
wherein a pair of the reset gates are disposed respectively in step portions formed so that an interval between side surfaces that are long sides of the light sensing part becomes narrower near the lower side surface.

(8)
The linear sensor according to (1),
wherein the readout gate is disposed along a lower side surface that is a short side of the light sensing part formed in an elongated shape,
wherein a pair of the reset gates are disposed respectively near the lower side surface where the readout gate is disposed along both side surfaces that are long sides of the light sensing part, and
wherein regions each having a highest concentration of an impurity are formed respectively, in the light sensing part, in a position similarly away from the readout gate and one of the pair of the reset gates and in a position similarly away from the readout gate and the other of the pair of the reset gates.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2012-151115 filed in the Japan Patent Office on Jul. 5, 2012, the entire content of which is hereby incorporated by reference.

What is claimed is:

1. A linear sensor comprising a plurality of sensor elements that are disposed in line, each sensor element including:
   a light sensing part that senses light, generates an electric charge according to an amount of the sensed light, and accumulates the electric charge,
   a readout gate that effects a read out of the electric charge accumulated in the light sensing part, and
   at least one reset gate that effects a discharge of the electric charge accumulated in the light sensing part so as to reset the light sensing part,
   wherein,
      in plan view, the light sensing part has at least one higher impurity region with an impurity concentration higher than that of a remainder of the light sensing part, the at least one higher impurity region being equidistant from the readout gate and the at least one reset gate.

2. The linear sensor according to claim 1, wherein for at least one sensor element:
   the light sensing part has an elongate shape with opposite short sides and opposite long sides and with end regions at opposite ends of the elongate shape, the long sides being longer than the short sides,
   the readout gate is disposed along one short side of the light sensing part at one end region, and
   the at least one reset gate is disposed along one long side of the one end region of the light sensing part.

3. The linear sensor according to claim 2, wherein a width of the readout gate is narrower than a width between side surfaces of the long sides of the light sensing part.

4. The linear sensor according to claim 2, wherein the light sensing part includes an inclined surface in the one end region that extends between the other long side and the one short side causing the light sensing part to taper in plan view proceeding toward the one short side.

5. The linear sensor according to claim 2, wherein,
   a corner portion of the one end region defined by the other long side and the one short side includes an impurity different than that of the light sensing part so as to cause the light sensing part to taper in plan view proceeding toward the one short side.

6. The linear sensor according to claim 1, wherein for at least one sensor element:
   the light sensing part has an elongate shape with opposite short sides and opposite long sides and with end regions at opposite ends of the elongate shape, the long sides being longer than the short sides,
   in plan view, each corner of one end region includes an inclined side so that the one end region tapers between the opposite long sides proceeding toward one short side,
   the readout gate is disposed along the one short side,
   the sensor element comprises two reset gates, and
   each reset gate is disposed along a respective one of the inclined sides.

7. The linear sensor according to claim 1, wherein for at least one sensor element:
   the light sensing part has an elongate shape with opposite short sides and opposite long sides and with end regions at opposite ends of the elongate shape, the long sides being longer than the short sides,
   the readout gate is disposed along one short side at one end region of the light sensing part,
   each of the long sides includes a step portion making the one end region narrower than a remainder of the light sensing part,
   the sensor element comprises two reset gates, and
   each reset gate is disposed in a respective one of the step portions such that an interval between side surfaces that are long sides of the light sensing part becomes narrower near a lower side surface.

8. The linear sensor according to claim 1, wherein for at least one sensor element:
   the light sensing part has an elongate shape with opposite short sides and opposite long sides and with end regions at opposite ends of the elongate shape, the long sides being longer than the short sides,
   the readout gate is disposed along one short side at one end region of the light sensing part,
   the sensor element comprises two reset gates,
   each reset gate is disposed along a respective one of the long sides in the one end region,
   the light sensing part has two higher impurity regions, and
   each higher impurity region is positioned equidistantly from the readout gate and a respective one of the reset gates.

9. An image sensor, comprising a plurality of pixels that are disposed in a matrix, each pixel including:
   a light sensing part that senses light, generates an electric charge according to an amount of the sensed light, and accumulates the electric charge,
   a readout gate that effects a read out of the electric charge accumulated in the light sensing part, and
   at least one reset gate that effects a discharge of the electric charge accumulated in the light sensing part so as to reset the light sensing part,
   wherein,
      in plan view, the light sensing part has at least one higher impurity region with an impurity concentration higher than that of a remainder of the light sensing part, the at least one higher impurity region being equidistant from the readout gate and the at least one reset gate.

10. An electronic apparatus comprising an image sensor including a plurality of pixels that are disposed in a matrix, each pixel including:
    a light sensing part that senses light, generates an electric charge according to an amount of the sensed light, and accumulates the electric charge,
    a readout gate that effects a read out of the electric charge accumulated in the light sensing part, and
    at least one reset gate that effects a discharge of the electric charge accumulated in the light sensing part so as to be reset,
    wherein,
       in plan view, the light sensing part has at least one higher impurity region with an impurity concentration higher than that of a remainder of the light sensing part, the at least one higher impurity region being equidistant from the readout gate and the at least one reset gate.

* * * * *